US008168965B2

(12) United States Patent
Rinzler et al.

(10) Patent No.: US 8,168,965 B2
(45) Date of Patent: May 1, 2012

(54) SEMICONDUCTOR DEVICE AND METHOD USING NANOTUBE CONTACTS

(75) Inventors: Andrew Gabriel Rinzler, Newberry, FL (US); Stephen J. Pearton, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 260 days.

(21) Appl. No.: 11/063,265

(22) Filed: Feb. 22, 2005

(65) Prior Publication Data

US 2005/0199894 A1 Sep. 15, 2005

Related U.S. Application Data

(60) Provisional application No. 60/546,483, filed on Feb. 20, 2004.

(51) Int. Cl.
*H01L 29/06* (2006.01)
*H01L 31/072* (2012.01)
*H01L 31/0328* (2006.01)

(52) U.S. Cl. ............ 257/12; 257/11; 257/13; 257/15; 977/700; 977/773

(58) Field of Classification Search ............ 977/700, 977/773, 932, 942; 257/15, 95, 11, 12, 13
See application file for complete search history.

(56) References Cited

U.S. PATENT DOCUMENTS

| | | | |
|---|---|---|---|
| 6,566,983 B2 * | 5/2003 | Shin | 333/193 |
| 6,590,231 B2 | 7/2003 | Watanabe | |
| 6,903,365 B1 * | 6/2005 | Nihei | 257/14 |
| 2006/0237805 A1 * | 10/2006 | Segal et al. | 257/414 |
| 2007/0114573 A1 * | 5/2007 | Han et al. | 257/226 |

FOREIGN PATENT DOCUMENTS

| | | |
|---|---|---|
| JP | 2002305087 | 10/2002 |
| JP | 2003209270 | * 7/2003 |
| WO | WO 2004/009884 | 1/2004 |

OTHER PUBLICATIONS

Gugang et al., Chemically doped double walled carbon nanotubes :cylindrical molecular capacitors, Jun. 27, 2003, vol. 90, No. 25, pp. 257403-1-257403-4.*
Lee, K. et al., Single Wall Carbon Nanotubes for p-Type Ohmic Contacts to GaN Light-Emitting Diodes, Nano Letters, vol. 4, No. 5, pp. 911-914 (2004).
Kaempgen, M. et al., Transparent CNT Composites, Molecular Nanostructures, XVII Int'l Winterschool/Euroconference on Electronic Properties of Novel Materials, 554-558 (2003).
Wu, Z. et al., Transparent Conductive Carbon Nanotube Films, Science, vol. 305:1273-1276 (Aug. 27, 2004).
Butt, N., Carbon-NanoTube Transistors, Purdue University, School of Electrical and Computer Engineering, West Lafayette, IN.

(Continued)

*Primary Examiner* — Samuel Gebremariam
(74) *Attorney, Agent, or Firm* — Saliwanchik, Lloyd & Eisenschenk

(57) ABSTRACT

A semiconductor device includes at least one semiconductor layer, a metal layer in electrical contact with the semiconductor layer, and a carbon nanotube contact layer interposed between the metal layer and the semiconductor layer. The contact layer electrically couples the metal layer to the semiconductor layer and provides a semiconductor contact having low specific contact resistance. The contact layer can be substantially optically transparent layer in at least a portion of the visible light range.

13 Claims, 4 Drawing Sheets

OTHER PUBLICATIONS

Robinson, J.A., et al., "Improved chemical detection using single-walled carbon nanotube network capicitors", *Sensors and Actuators A*, 2007, 135, 309-314.

Peng, Shu, et al., "Carbon Nanotube Chemical and Mechanical Sensors", Conference Paper for the 3rd International Workshop on Structural Health Monitoring.

Nguyen, L.H et al., "Synthesis of multi-walled carbon nanotubes for $NH_3$ gas detection", *Physica E*, 2007, 37, 54-57.

Miranda, et al., "Design of a chemical sensor based on a Carbon Nanotube functionalized with DNA", PASEO 2009, Buenos Aires, Argentina, Mar. 2009.

Bradley, Keith, et al., "Short-channel effects in contact-passivated nanotube chemical sensors", *Applied Physics Letters*, 2003, 83, 18, 3821-3823.

\* cited by examiner

| Structure | Specific contact resistance (Ω-cm$^2$) | |
| --- | --- | --- |
| | 700°C, N$_2$, 1min | No anneal |
| Carbon nanotube | $1.31 \times 10^{-4}$ | $5.4 \times 10^{-3}$ |
| CNT/p-GaN | 0.011 | 0.12 |
| Ni/Au/p-GaN | 0.033 after 500C | Non Ohmic |

FIG. 3

SEMICONDUCTOR DEVICE AND METHOD USING NANOTUBE CONTACTS

CROSS-REFERENCE TO RELATED APPLICATIONS

This application claims the benefit of Provisional Patent Application No. 60/546,483 entitled "SEMICONDUCTOR DEVICE AND METHOD USING NANOTUBE CONTACTS" filed on Feb. 20, 2004, and is incorporated by reference herein its entirety.

STATEMENT REGARDING FEDERALLY SPONSORED RESEARCH OR DEVELOPMENT

Not applicable.

FIELD OF THE INVENTION

The invention relates to electronic and optoelectronic semiconductor devices that include nanotube comprising contact layers which reduce the contact resistance to one or more semiconductor layers.

BACKGROUND

Electronic transport at the junction between different materials is governed by the band structure line-up between the respective materials and their relative chemical potentials. Misalignment between bands leads to electrical potential barriers that must be overcome for carrier transport to occur. Moreover, equilibration of the chemical potentials occurs when the materials are brought into contact, and results in the formation of a space charge layer that is depleted of free carriers that cause additional barriers to transport and generally degraded device performance.

Low resistance Ohmic contacts to both n and p-type semiconductors are generally required for proper device operation. High contact resistance results in a substantial voltage drop at the contact which can lead to both ac and dc performance degradation, such as switching speed and voltage swing, respectively. Moreover, high contact resistance can lead to reliability degradation through associated Ohmic heating.

In some applications, the electrical contact must also be optically transparent. For example, low resistance transparent p-Ohmic contacts are generally required for GaN light-emitting diodes and laser diodes. One of the lifetime-limiting factors in GaN laser diodes has been the p-Ohmic contact. Due to the relatively high specific contact resistances ($r_c$) achievable, the metallization heats-up as current flows across the p-n junction, leading to metal migration down threading dislocations in the GaN layers and eventual shorting of the junction. There are a number of contributing factors to the high $r_c$ values for contacts to p-GaN, including:

(i) The absence of a metal with a sufficiently high work function. The bandgap of GaN is 3.4 eV, and the electron affinity is 4.1 eV, but metal work functions are typically $\leq 5$ eV.

(ii) The relatively low hole concentrations in p-GaN due to the deep ionization level of the Mg acceptor is about 170 meV.

(iii) The tendency for the preferential loss of nitrogen from the GaN surface during processing, which may produce surface conversion to n-type conductivity.

An additional desirable property of the contact metallurgy in GaN light-emitting diode structures is a high transmittance for visible light, in order to maximize the light output from the top surface of the LED. A general approach in this case is to use a very thin metal contact on the p-layer.

In the search for improved electrical contacts, a wide variety of metallizations have been disclosed. Again with reference to GaN based LEDs, standard Ni/Au, Ni, Au, Pd, Pd/Au, Pt/Au, Au/Mg/Au, Au/C/Ni, Ni/Cr/Au) and Pd/Pt/Au have been disclosed. Typically, at the contact, Ni, Pd or Pt metal is in direct contact with the P—GaN, and the structure is annealed at 400-750° C. This produces contact resistances in the $10^{-1}$ to $10^{-3}$ $\Omega$-cm$^2$ range. For higher temperatures, severe degradation in contact morphology is observed, usually resulting from the formation of the metal gallides.

Indium-tin-oxide (ITO) has been used as the transparent bottom electrode in GaN ac thin film electroluminescent devices and has been used an overlayer on transparent Ni/Au contacts on p-GaN to lower contact resistance. In general, ITO contacts alone show rectifying behavior on p-type GaN, even after annealing, and is more typically used as an Ohmic transparent layer on n-GaN.

SUMMARY

A semiconductor device comprises at least one semiconductor layer, a metal comprising layer in electrical contact with the semiconductor layer, and a carbon nanotube comprising contact layer interposed between the metal layer and the semiconductor layer. The nanotube contact layer electrically couples the metal layer to the semiconductor layer. In one embodiment of the invention, the nanotube contact layer consists essentially of single wall nanotubes (SWNTs). The contact layer can be substantially optically transparent layer in at least a portion of the visible light range.

In one embodiment of the invention, the at least one semiconductor layer comprises a first GaN layer comprising a p-GaN or n-GaN layer which forms a p-n junction with a second GaN comprising semiconductor layer to form a GaN LED, wherein the nanotube contact layer provides a contact between the metal layer and the p-GaN layer. In this embodiment, the specific contact resistance ($r_c$) at 25 C of the metal layer to the p-GaN layer can be less than $2.0 \times 10^{-2}$ $\Omega$cm$^2$.

The nanotube contact layer can include at least one charge transfer doping species, the charge transfer doping species reducing a difference in Fermi level between the nanotube contact layer and the semiconductor layer being contacted. The doping species can be a halogen or an alkali metal. The nanotube contact layer can provide a sheet resistance of less than 200 ohm/sq at a thickness of 100 nm.

A method of forming low resistance nanotube-based contacts to semiconducting layers comprises the steps of providing a semiconducting layer, depositing or placing a nanotube contact layer on the semiconductor layer, and depositing a metal layer on the nanotube contact layer. An Ohmic contact can be formed between the semiconductor layer and the metal layer following deposition of the metal layer at a temperature less than 200 C, whereby an annealing step is not required to form the Ohmic contact. The method can include the step of chemically doping the nanotube contact layer using at least one charge transfer doping species layer. The nanotube contact layer can consist essentially of single walled carbon nanotubes (SWNTs).

The nanotube contact layer can be disposed on a porous membrane support layer before the step of depositing the nanotube contact layer. In one embodiment, nanotubes can be forced onto a surface of the membrane to form a nanotube contact layer disposed on the membrane. The step of depositing the contact layer can comprise placing the nanotube contact layer in contact with the semiconductor layer, and then removing the porous membrane support.

BRIEF DESCRIPTION OF THE DRAWINGS

A fuller understanding of the present invention and the features and benefits thereof will be obtained upon review of the following detailed description together with the accompanying drawings, in which:

FIG. 3 shows specific contact resistance ($r_c$) data obtained using transmission line method (TLM) measurements for a carbon nanotube, carbon nanotube (CNT)/P—GaN according to the invention, and a conventional Ni/Au/P—GaN contact both after high temperature (700 C) anneal in $N_2$, and without an anneal.

DETAILED DESCRIPTION

Figure 1:
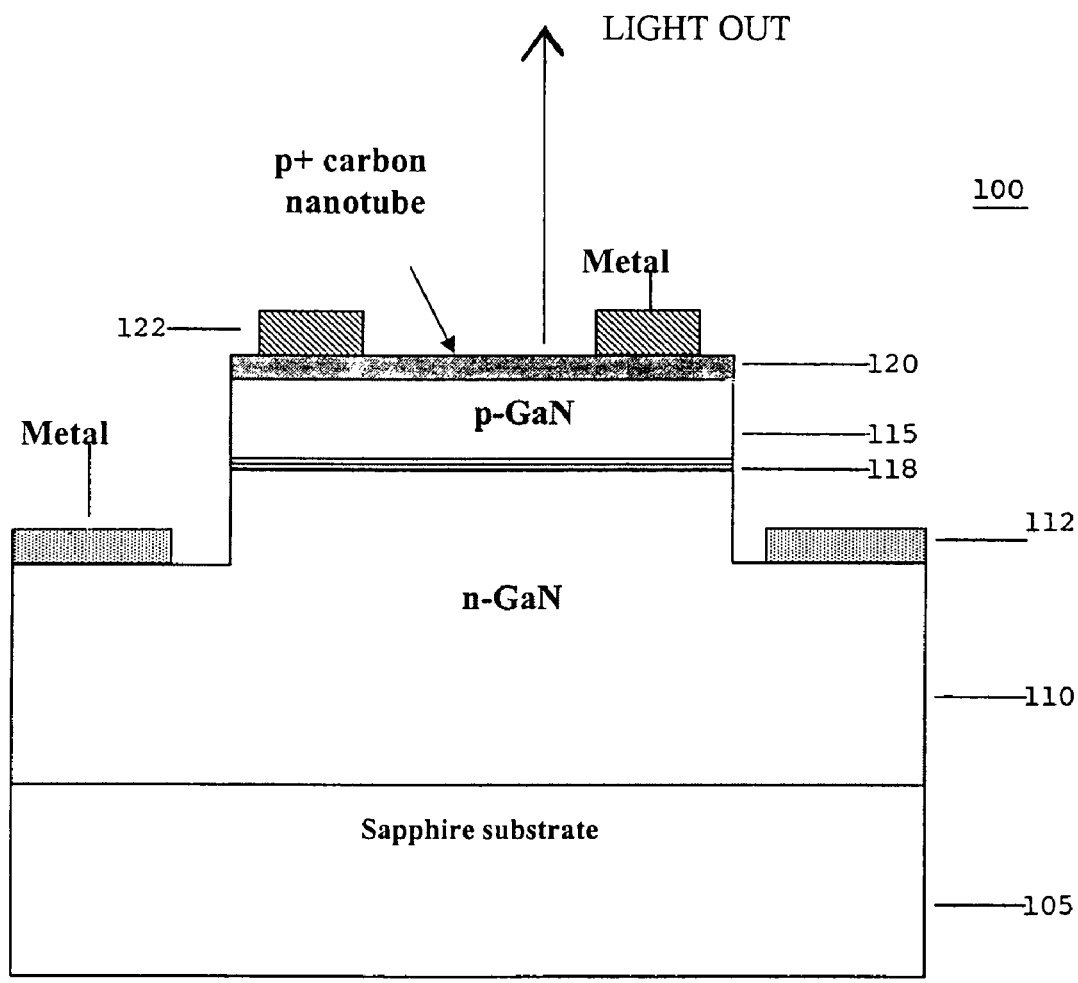
FIG. 1 is a schematic of a GaN LED structure including a carbon nanotube contact layer disposed between the metal and the p-GaN layer, according to an embodiment of the invention.

Carbon nanotubes have recently received attention due to their unique electronic, thermal mechanical properties. Depending on its specific crystalline structure, specified by its (n, m) index, a single nanotube can be either intrinsically metallic or semiconducting. Bulk single wall nanotube (SWNT) samples currently commercially available consist of a molecularly intimate mixture of metallic (typically a ⅓ wt. fraction) and semiconducting (typically a ⅔ wt. fraction) nanotubes. Recent work regarding nanotubes has concentrated on separating the metallic from semiconducting nanotubes for various applications, a task made particularly challenging by the molecular intimacy of the mixture.

Regarding multi-walled nanotubes (MWNT), each shell in a MWNT is either metallic or semiconducting. As the diameter of a semiconducting shell increases its bandgap decreases. The bandgap for 1.4 nm diameter semiconducting nanotubes is about 0.6 eV. The bandgap for a 10 nm shell is about 0.08 eV, close to the thermal excitation energy at room temperature (0.040 eV).

Relating to electronic devices, substantial effort has been focused on creating nanoscale devices using active semiconducting nanotube layers. For example, U.S. Pat. No. 6,590,231 to Watanabe, et al. entitled "Transistor that uses carbon nanotube ring" discloses use of nanotubes for the channel region of MOSFETs.

In contrast to Watanabe, et al., the invention described herein uses nanotubes in contact regions to improve transfer of electric charge between metal electrodes and active layers which comprise semiconducting materials. A semiconductor device according to one embodiment of the invention includes at least one semiconductor layer, a metal comprising layer in electrical contact with the semiconductor layer, and a carbon nanotube comprising contact layer interposed between the metal layer and the semiconducting layer. The contact layer electrically couples the metal layer to the semiconductor layer and provides a semiconductor contact having low specific contact resistance. The semiconductor comprising device can be a discrete device (e.g. diode or transistor), or be part of an integrated device, such as a microprocessor or memory device. The device can be an electronic or optoelectronic device, and can include mechanical components on chip, such as embodied with one or more MEMS devices.

Rather than attempting to separate semiconducting from metallic nanotubes for previous nanotube applications for electronics, the inventors have discovered that intimately mixed nanotube materials have properties well suited for use as an intermediary layer possessing substantial advantages for electrically coupling metals to semiconductors. It has been discovered that the metal layer generally couples well without a barrier to the metallic nanotubes present in the nanotube mixture.

Although not needed to practice the claimed invention, Applicants, not seeking to be bound to theory, present a mechanism which explains the low resistance contacts provided by nanotube comprising layers according to the invention. The large contact area between the intimately mixed metallic and semiconducting nanotubes serves to transmit appreciable current even if a barrier between them develops. The semiconducting nanotubes in the mixture also couple well electrically to various semiconductors. Metallic nanotubes are believed to distribute electrical contact throughout the nanotube layer so that contact to a metal layer can be localized to a small region of the nanotube layer and still provide a low resistance contact.

Semiconducting nanotubes have generally been found to be p-type conductors, indicating their direct application for contact to p-type semiconducting materials. However, the range of semiconductors for which the nanotubes may provide good electrical coupling can be substantially broadened by chemical charge transfer doping. Chemical doping of nanotubes, and the effect of chemical doping on the Fermi level of nanotubes, is described in co-pending and commonly assigned U.S. patent application Ser. No. 10/622,818 entitled "Transparent electrodes from single wall carbon nanotubes" filed on Jul. 18, 2003 ('818) and published on Oct. 7, 2004 as Published application No. 20040197546. '818 is hereby incorporated by reference into this application in its entirety.

One or more of the broad family of elements and compounds that form charge transfer complexes with nanotubes can be used to chemical charge transfer dope the nanotubes, such as halogens or alkali metals. Using such materials, the nanotube Fermi level of the nanotubes can be readily and controllably tuned and can be rendered to be either n-type or p-type. Unlike typical semiconductor doping, which involves dilute replacement of atoms comprising the crystalline lattice, no atoms of the nanotube lattice need to be removed. Instead, a simple charge transfer between the dopant species and the nanotubes occurs essentially spontaneously, upon exposure to the appropriate chemical(s). Thus, band alignment between the nanotube layer and the semiconductor layer to be contacted can be improved using charge transfer doping. If desired, it is expected that the Fermi level of the nanotube layer can be brought within about 0.1 volts (or closer) to the Fermi level of the semiconductor layer to be contacted. Suppression of absorption bands with chemical doping indicates that the Fermi level of nanotubes can be shifted by at least ±1 eV.

The nanotube layer can comprise MWNTs or SWNTs, or mixtures thereof. However, pure SWNT layers are generally preferred when chemical doping is desired since chemical doping of MWNTs is generally limited to the outer layer so the possible Fermi level shift is much lower as compared to SWNTs. Recently, methods for producing ultra-thin, homogeneous films of pure single wall carbon nanotubes (without binder) have become available. In some applications, the nanotube contact layer is required to be optically transparent in the wavelength range of emission provided by the device. Optical transparency is important for some semiconductor applications, such as for light emitting devices.

By using thin SWNT layers, such as on the order of about 1 µm, or less, such as 100 to 400 nm thick, the nanotube layer can be substantially optically transparent in the visible and/or infrared range. As used herein, the phrase "substantially optically transparent" refers to a nanotube comprising film that provides at least 10% optical transmission throughout a wavelength range from about 0.4 µm to 10 µm, such as for a film having a thickness of at least 100 nm. A 100 nm SWNT film can also provide at least 50% optical transmission throughout a range from about 3 µm to 5 µm. It is noted however that these are nominal values based on a specific sample of nanotubes. The spectral transparency provided by nanotube comprising layers according to the invention depends upon the specific ratio of metallic to semiconducting nanotubes, the distribution of nanotube diameters present and the charge transfer doping state of the nanotubes (if present).

Although generally described as being a homogeneous films of essentially pure SWNTS which are optically transparent for use as an electrically conducting transparent electrode, the nanotube contact layer according to the invention can more generally include MWNTs. Moreover, as noted above, the nanotube contact layer can generally be non-optically transparent for applications which do not require optical transparency (e.g. transistors).

Nanotubes also provide an additional important advantage in electrical coupling to circuit elements. Among the challenges facing microelectronic in the push to greater device densities is electromigration of species at conductor-semiconductor or conductor-insulator junctions. This effect is exacerbated by the increasing electric fields, as individual device dimensions shrink. The ease with which species migration occurs is related to the atomic binding strength of the material. Bonds must be broken and reformed for atomic migration to occur. Carbon atoms comprising the nanotube sidewalls are exceptionally tightly bound, requiring about 7 eV per atom to remove, compared to 1 to 3 eV for elemental metal materials. Thus, electro-migration of the carbon from the nanotubes will be effectively non-existent. Moreover, the nanotubes themselves are simply too large to migrate as a whole. The converse is also true. The migration of chemical species from the adjacent material into the nanotube crystalline structure will also not measurably occur.

Nanotubes can be applied in a variety of ways to form low resistance contacts to semiconductor layers. For the general purpose of making low resistance electrical contact to semiconductors, for example, the nanotubes can be air brushed on, painted on, or drop cast on. Although these methods generally do not produce layers having highly uniform thickness, low resistance Ohmic contacts are generally achieved.

In an alternate embodiment, an optically transparent nanotube layer is formed. One process for forming the optically transparent nanotube layer is described in '818. As described in '818, a method of forming optically transparent and electrically conductive SWNT films includes the steps of providing a porous membrane and dispersing a plurality of SWNTs into a solution, the solution including at least one surface stabilizing agent for preventing the SWNTs from flocculating out of suspension. The solution is then applied to a porous membrane. The solution is then removed, wherein the SWNTs are forced onto the surface of the porous membrane to form a SWNT film on the membrane. The method can include the step of separating the SWNT film from the porous membrane, such as by dissolving the membrane.

Applied to the present invention, the nanotube side of the nanotube/support layer article can be placed on the semiconductor surface(s), such as over the entire top surface of a silicon wafer. The support layer can then be selectively removed, such as by dissolving the membrane. The process can then be continued to add subsequent layers, if desired.

Due to the significant temperature stability provided nanotubes, nanotube contact layers according to the invention are highly compatible with conventional integrated circuit processing. For example, it has been shown that in ambient air, in the absence of catalysts that activate their oxidation (e.g. transition metals), SWNTs can tolerate temperatures greater than 400° C. If protected from an oxidizing atmosphere, such as in an inert gas atmosphere (e.g. $N_2$ or Ar) or if suitably coated, nanotubes are stable to well over 1000° C. Thus, for interlevel dielectric deposition, PECVD nitride deposition process would generally be preferred as compared to a PECVD oxide deposition process because the nitride deposition process is inherently reducing, whereas the oxide process is inherently oxidizing.

Standard integrated circuit processing can be used to pattern nanotube comprising layers according to the invention. For example, photoresist patterns can be formed on the nanotube layer which expose regions to be removed. Plasma etching in an oxygen comprising environment can be used to remove the nanotube comprising layer. It is expected that attainable nanotube contact dimensions will approach at least about 100 nm.

EXAMPLES

The present invention is further illustrated by the following specific examples, which should not be construed as limiting the scope or content of the invention in any way.

A GaN quantum well LED 100 shown in FIG. 1 was grown by Metal Organic Chemical Vapor Deposition (MOCVD) on a c-plane electrically insulating sapphire ($Al_2O_3$) substrate 105. The hole concentration in the p-GaN layer 115 was about $1\times10^{17}$ cm$^{-3}$. The n-GaN layer 110 had an electron concentration of $5\times10^{18}$ to $10^{19}$ cm$^{-3}$. The junction region is indicated by reference 118. To form the P+ nanotube layer 120, purified, pulsed laser vaporization grown SWNTs were dispersed by ultra-sonication in aqueous surfactant suspension (1% v/v TRITON X-100™) at a dilute concentration of about $1.5\times10^{-3}$ mg/ml. The suspension was vacuum filtered onto 0.1 µm pore size, mixed cellulose ester membrane (Millipore, Billerica, Mass.) followed by washing with copious quantities of de-ionized water to remove the surfactant. A 1500 Å nanotube film was formed on the membrane for use as a transparent electrode.

To transfer the nanotube film, the still wet membrane was placed nanotube film side down onto the p-GaN layer 115. The assembly was subsequently covered with porous filter paper and loaded with a 4 kg mass to dry flat overnight, leaving the nanotube film (with the membrane still attached) adhered to the p-GaN layer 115. The adhesion is typically adequate to permit subsequent dissolution of the membrane in successive acetone baths followed by a final methanol bath without disturbing the nanotube film (successive baths used to minimize dissolved cellulose ester trapped in the nanotube film). Once dry, the nanotube 120/p-GaN 115/n-GaN 110/substrate 105 assembly was annealed at 600° C. for 6 hr in Ar to remove the last vestiges of cellulose ester membrane. E-beam deposited Ti/Al/Pt/Au, Pd/Au or Pd only were patterned by lift-off and a mesa formed by $Cl_2$/Ar Inductively Coupled Plasma etching to expose the n-GaN side of the junction. The metal contacts 112 to n-GaN 110 were Ti/Al/Pt/Au, annealed at 700° C. for 1 min under $N_2$. Similarly, metal contacts 122 were formed on the nanotube layer 120.

In addition, CNT films were also deposited on single-layer p-GaN on sapphire and the specific contact resistance ($r_c$) measured using the transmission line method (TLM) in structures in which the CNT films were either patterned or not patterned and interposed between the metal layer and the p-GaN layer. The specific contact resistance ($r_c$) in each case was obtained from the total measured resistance of the structure R=2Rc+Rs (L/W) via the relation $r_c=(Rc^2/Rs)W^2$, where $R_C$ is the measured contact resistance, Rs/W is the slope of the plot of resistance versus pad spacing, W the pad width, and L the pad spacing.

Figure 2:
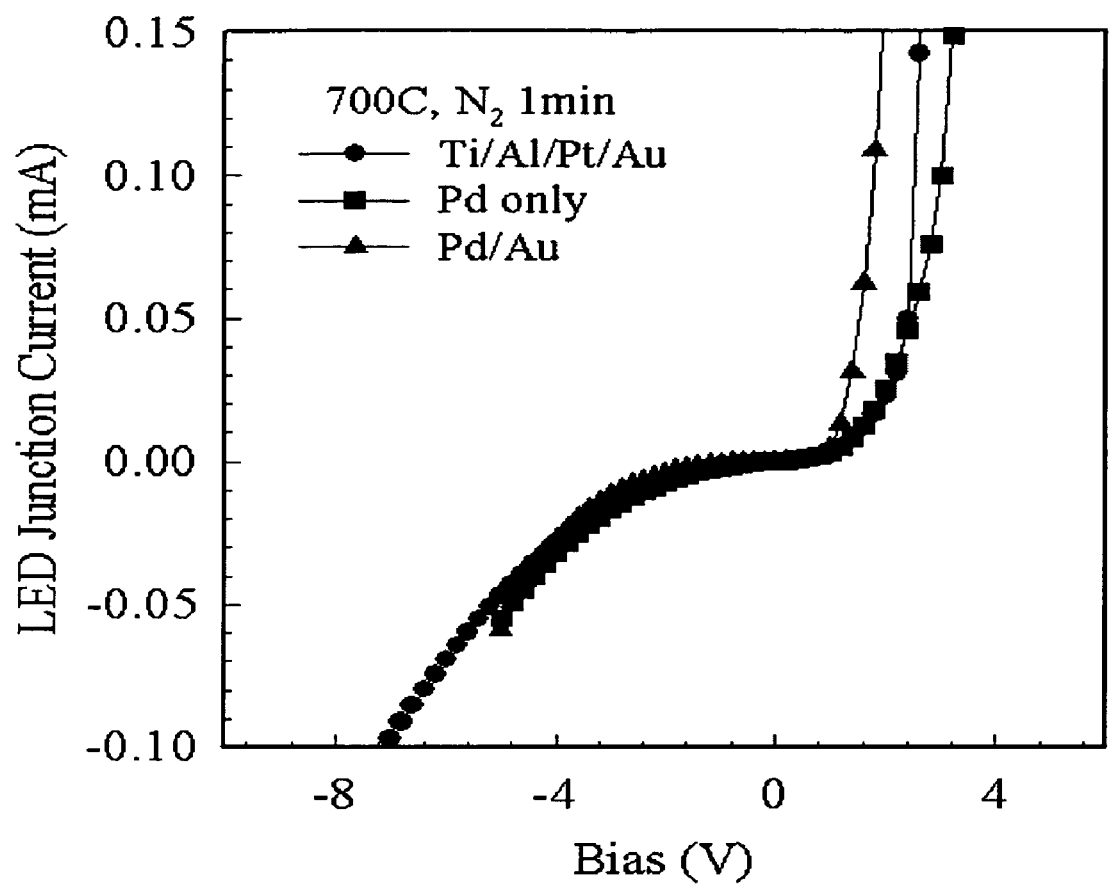
FIG. 2 shows the junction current-voltage (I-V) characteristics of an exemplary LED according to the invention including a carbon nanotube contact layer with various metals on top of the nanotube contact layer for contact to a p-GaN layer.

FIG. 2 shows the junction current-voltage (I-V) characteristics of LEDs with various metals on top of the CNT films on a p-GaN layer according to the invention. In each case, the junction exhibits excellent rectifying characteristics. Thus, the SWNT contact layer provides an excellent Ohmic contact in spite of the p-GaN layer having relatively low hole concentration (about $1\times10^{17}$ cm$^{-3}$). The contact resistance data derived from TLM measurements is shown in FIG. 3. The CNT films themselves are very conducting and lead to a contact resistance of $5.4\times10^{-3}$ $\Omega$cm$^2$ for as-deposited Ti/Al/Pt/Au contacts on these films for the case in which the current flow is predominantly through the CNT film to $1.3\times10^{-4}$ $\Omega$cm$^2$ after the 700° C. $N_2$ anneal for 1 minute. In the case where the CNT is patterned so that current is also forced to flow through the p-GaN, the contact resistance of this structure was found to be $1.1\times10^{-2}$ $\Omega$cm$^2$ after the 700° C. anneal, but the CNT produces Ohmic behavior even in the as-deposited case. This is in sharp contrast to the case of standard Ni/Au contacts on the same layer (no intermediate nanotube layer), which were non-Ohmic as-deposited.

It is also noted that the SWNT contact structure had a contact resistance a factor of 3 lower than the lowest value obtained with the Ni/Au metallization directly on p-GaN. The lowest value occurred at 500° C. for that metallization and by 700° C. the contact morphology of the Ni/Au was badly degraded likely through reaction of the contact metals with the GaN. Thus, one advantage of the CNT films is that they are stable at the anneal temperature needed for producing the lowest contact resistance on the n-side of the junction, simplifying the processing sequence.

Figure 4:
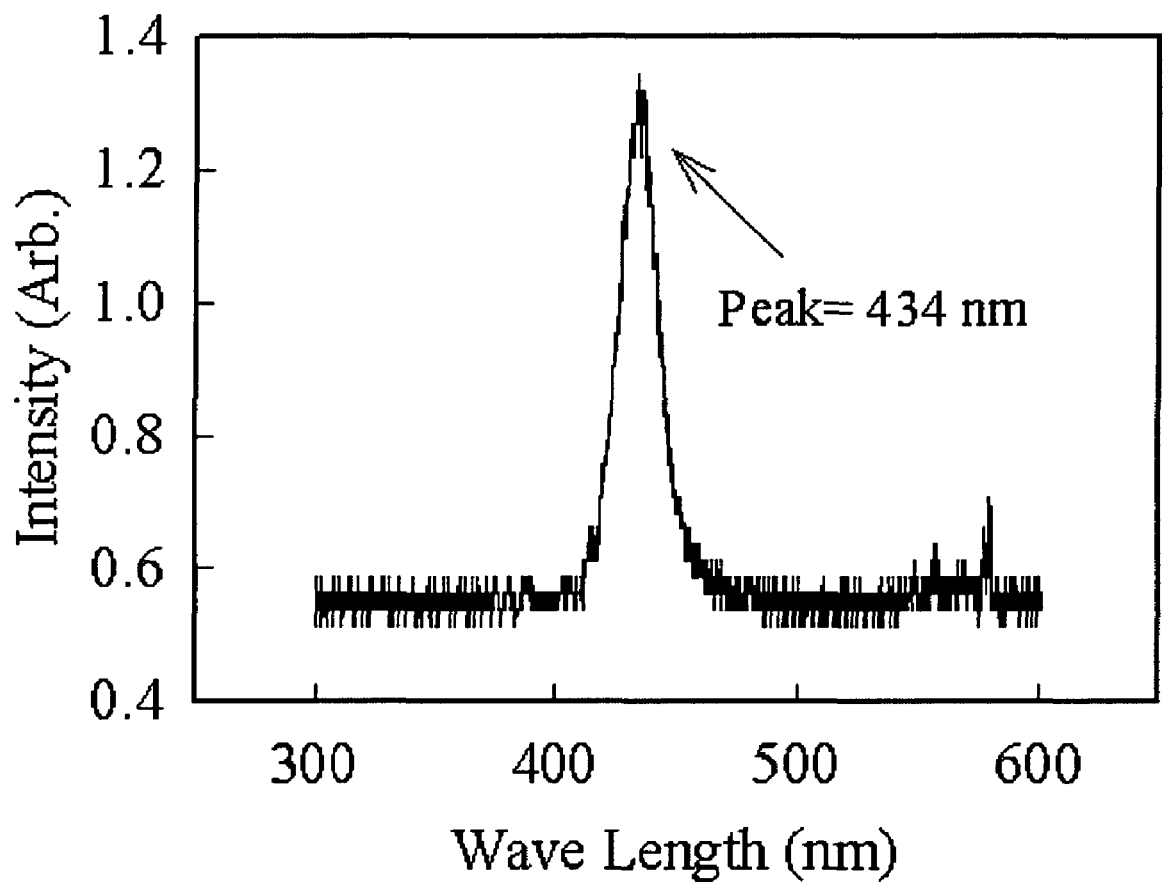
FIG. 4 shows the luminescent response of a completed GaN LED according to an embodiment of the invention which includes a carbon nanotube contact layer demonstrating strong electroluminescence peaked at 434 nm (blue light).

FIG. 4 shows the luminescent response of a completed GaN LED according to an embodiment of the invention which includes a carbon nanotube contact layer demonstrating a strong electroluminescence peaked at 434 nm (blue light). This demonstrates both the highly Ohmic nature of the junction as well as the substantial optical transparency of the nanotube layer.

The Examples provide herein demonstrate low resistance, optically transparent CNT films according to the invention produce excellent p-Ohmic contacts to GaN whose thermal stability allows one to perform the n-contact anneal with the p-contact in place. Other potential similar applications include low resistance contacts on p-type ZnO, which has similar issues as with p-GaN. Moreover, as noted above, the invention can be broadly applied to contacting n-type layers as well, and be used in the fabrication of variety of integrated circuits, including those having MEMS devices.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A semiconductor device, comprising:
   a first layer, wherein said first layer comprises a semiconductor;
   a second layer, wherein said second layer comprises a metal; and
   a third layer, wherein said third layer consists of carbon nanotubes, wherein said third layer has a low resistance, wherein said third layer physically contacts and physically separates said first layer and said second layer, wherein said third layer electrically connects said first layer to said second layer, wherein the semiconductor device is configured to apply a voltage between said second layer and said first layer, wherein upon application of the voltage, current flows from said second layer to said first layer or from said first layer to said second layer, and wherein said semiconductor device is a transistor or diode.

2. The device of claim 1, wherein said carbon nanotubes consists essentially of single wall carbon nanotubes (SWNTs).

3. The device of claim 1, wherein said third layer is substantially optically transparent in at least a portion of the visible light range.

4. The device of claim 1, wherein said diode is a light emitting diode (LED).

5. A semiconductor device, comprising:
   a first layer, wherein said first layer comprises a p-GaN semiconductor;
   a second layer, wherein said second layer comprises a metal;
   a third layer, wherein said third layer consists essentially of carbon nanotubes, wherein said third layer resides between and physically contacts at least portions of both first and second layers, wherein electrical coupling of said first layer to said second layer occurs only through said third layer; and
   a fourth layer, wherein said fourth layer comprises an n-GaN semiconductor which forms a p-n junction with said first layer, wherein said device is a GaN LED.

6. The device of claim 5, wherein a specific contact resistance at 25 C of said first layer to said third layer is less than $2.0\times10^{-2}$ $\Omega$cm$^2$.

7. A semiconductor device, comprising:
   a first layer, wherein said first layer comprises a semiconductor;
   a second layer, wherein said second layer comprises a metal; and
   a third layer, wherein said third layer consists of carbon nanotubes, wherein said third layer has a low resistance, wherein said third layer physically contacts and physically separates said first layer and said second layer, wherein said third layer electrically connects said first layer to said second layer, wherein the semiconductor device is configured to apply a voltage between said second layer and said first layer, and wherein upon application of the voltage, current flows from said second layer to said first layer or from said first layer to said second layer, wherein said third layer includes at least one charge transfer doping species, said charge transfer doping species changes the difference in Fermi level between said third layer and said first layer, and wherein said semiconductor device is a transistor or diode.

8. The device of claim 7, wherein said doping species is a halogen or an alkali metal.

9. The device of claim 7, wherein said third layer provides a sheet resistance of less than 200 ohm/sq at a thickness of 100 nm.

10. A method of forming low resistance nanotube-based contacts to semiconducting layers, comprising the steps of
   providing a semiconductor layer;
   depositing or placing a carbon nanotube layer directly on a surface of said semiconductor layer; and
   depositing a metal layer directly on said carbon nanotube layer wherein said metal layer is separated from said semiconductor layer by said carbon nanotube layer, wherein a contact between said carbon nanotube layer and said semiconductor layer is in a semiconducting device, and wherein said semiconductor device is a transistor or diode.

11. The method of claim 10, further comprising the step of chemically doping said carbon nanotube layer using at least one charge transfer doping species, said charge transfer doping species reducing a difference in Fermi level between said carbon nanotube layer and said semiconductor layer.

12. The method of claim 10, wherein said carbon nanotube layer consists essentially of single walled carbon nanotubes (SWNTs).

13. The method of claim 10, wherein said carbon nanotube layer provides a sheet resistance of less than 200 ohm/sq at a thickness of 100 nm.

* * * * *

UNITED STATES PATENT AND TRADEMARK OFFICE
CERTIFICATE OF CORRECTION

| | | |
|---|---|---|
| PATENT NO. | : 8,168,965 B2 | Page 1 of 1 |
| APPLICATION NO. | : 11/063265 | |
| DATED | : May 1, 2012 | |
| INVENTOR(S) | : Andrew Gabriel Rinzler and Stephen John Pearton | |

It is certified that error appears in the above-identified patent and that said Letters Patent is hereby corrected as shown below:

<u>Title page, item [57] Abstract,</u>
Line 7, "can be substantially" should read --can be a substantially--.

<u>Column 1,</u>
Line 1, "herein its entirety" should read --herein in its entirety--.

Line 52, "$\leqq 5eV$" should read --$\leq 5eV$--.

<u>Column 2,</u>
Line 7, "Ni/Cr/Au) and" should read --Ni/Cr/Au, and--.
Line 16, "used an overlayer" should read --used as an overlayer--.
Line 32, "can be substantially" should read --can be a substantially--.

<u>Column 6,</u>
Lines 9-10, "provided nanotubes" should read --provided by nanotubes--.

<u>Column 7,</u>
Line 53, "The Examples provide herein" should read --The Examples provided herein--.
Lines 54-55, "invention produce" should read --invention that produce--.
Line 61, "of variety" should read --of a variety--.

<u>Column 8,</u>
Line 22, "consists essentially" should read --consist essentially--.

Signed and Sealed this
Twenty-eighth Day of August, 2012

David J. Kappos
*Director of the United States Patent and Trademark Office*

UNITED STATES PATENT AND TRADEMARK OFFICE
CERTIFICATE OF CORRECTION

PATENT NO. : 8,168,965 B2
APPLICATION NO. : 11/063265
DATED : May 1, 2012
INVENTOR(S) : Andrew Gabriel Rinzler and Stephen John Pearton It is certified that error appears in the above-identified patent and that said Letters Patent is hereby corrected as shown below:

<u>Title page, item [57] Abstract,</u>
Line 7, "can be substantially" should read --can be a substantially--.

<u>Column 1,</u>
Line 1, "herein its entirety" should read --herein in its entirety--.
Line 59, "$\leqq 5eV$" should read --$\leq 5eV$--.

<u>Column 2,</u>
Line 7, "Ni/Cr/Au) and" should read --Ni/Cr/Au, and--.
Line 16, "used an overlayer" should read --used as an overlayer--.
Line 32, "can be substantially" should read --can be a substantially--.

<u>Column 6,</u>
Lines 9-10, "provided nanotubes" should read --provided by nanotubes--.

<u>Column 7,</u>
Line 53, "The Examples provide herein" should read --The Examples provided herein--.
Lines 54-55, "invention produce" should read --invention that produce--.
Line 61, "of variety" should read --of a variety--.

<u>Column 8,</u>
Line 22, "consists essentially" should read --consist essentially--.

This certificate supersedes the Certificate of Correction issued August 28, 2012.

Signed and Sealed this
Ninth Day of October, 2012

David J. Kappos
*Director of the United States Patent and Trademark Office*